(12) United States Patent
Badereddine et al.

(10) Patent No.: US 9,418,759 B2
(45) Date of Patent: Aug. 16, 2016

(54) ASSIST CIRCUITS FOR SRAM TESTING

(71) Applicants: Nabil Badereddine, Grasse (FR); Leonardo H. Bonet Zordan, Montpellier (FR); Patrick Girard, Villetelle (FR); Alberto Bosio, Montpellier (FR)

(72) Inventors: Nabil Badereddine, Grasse (FR); Leonardo H. Bonet Zordan, Montpellier (FR); Patrick Girard, Villetelle (FR); Alberto Bosio, Montpellier (FR)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/270,555

(22) Filed: May 6, 2014

(65) Prior Publication Data

US 2015/0325313 A1 Nov. 12, 2015

(51) Int. Cl.

| | | |
|---|---|---|
| *G11C 29/04* | (2006.01) | |
| *G11C 29/12* | (2006.01) | |
| *G11C 11/419* | (2006.01) | |
| *G11C 29/50* | (2006.01) | |
| *G11C 11/41* | (2006.01) | |

(52) U.S. Cl.
CPC ............. *G11C 29/12* (2013.01); *G11C 11/419* (2013.01); *G11C 29/04* (2013.01); *G11C 29/50* (2013.01); *G11C 11/41* (2013.01); *G11C 2029/1202* (2013.01); *G11C 2029/1204* (2013.01); *G11C 2029/5002* (2013.01); *G11C 2029/5006* (2013.01)

(58) Field of Classification Search
CPC ............ H01L 27/115; H01L 27/11521; H01L 27/11526; H01L 27/11531; G06T 2207/30148; G11C 11/401
See application file for complete search history.

(56) References Cited

U.S. PATENT DOCUMENTS

| | | | | | |
|---|---|---|---|---|---|
| 4,715,034 | A | * | 12/1987 | Jacobson | G11C 29/36 365/201 |
| 5,687,178 | A | * | 11/1997 | Herr | G11C 29/02 365/200 |
| 7,042,780 | B2 | * | 5/2006 | Lee | G11C 29/52 365/201 |
| 8,315,117 | B2 | * | 11/2012 | Zhang | G11C 5/147 365/200 |
| 8,599,623 | B1 | * | 12/2013 | Clark | G11C 29/1201 365/189.02 |
| 8,923,600 | B2 | * | 12/2014 | Zafar | G03F 1/84 382/144 |
| 2004/0022115 | A1 | * | 2/2004 | Park | G11C 5/147 365/226 |
| 2004/0061517 | A1 | * | 4/2004 | Stirrat | G01R 31/31835 324/762.02 |
| 2008/0062746 | A1 | * | 3/2008 | Loh | G11C 7/02 365/154 |
| 2010/0188909 | A1 | * | 7/2010 | Kenkare | G11C 11/419 365/189.16 |
| 2010/0275074 | A1 | * | 10/2010 | Nicolaidis | G11C 29/56 714/718 |
| 2012/0263002 | A1 | * | 10/2012 | Huang | G11C 29/025 365/201 |
| 2013/0033948 | A1 | * | 2/2013 | Braceras | G11C 29/025 365/201 |
| 2013/0077387 | A1 | * | 3/2013 | Yabuuchi | G11C 11/419 365/154 |
| 2013/0258786 | A1 | * | 10/2013 | Chakravarty | G11C 7/1075 365/189.02 |
| 2015/0279438 | A1 | * | 10/2015 | Kulkarni | G11C 7/12 365/96 |

* cited by examiner

*Primary Examiner* — Jaehwan Oh
(74) *Attorney, Agent, or Firm* — Chapin IP Law, LLC

(57) ABSTRACT

Assist circuits for SRAM memory tests allow voltage scaling in low-power SRAMs. Word line level reduction (WLR) and negative bit line (NBL) boost assist techniques improve read stability and write margin of SRAM core-cells, respectively, when the memory operates at a lowered supply voltage. Assist circuits are activated at particular points in the memory cell circuit. The assist circuits are selectively activated for modifying the voltage along particular circuit elements to identify the potential defects that might be otherwise masked until substantially large. A March test invokes elements for activating the assist circuits to identify defects and indicate functional fault models (FFMs) associated with the defects.

15 Claims, 7 Drawing Sheets

| Defect | FFM | Corner | WLR: STRONG NBL: ON | WLR: NORMAL NBL: ON | WLR: OFF NBL: ON | WLR: STRONG NBL: OFF | WLR: NORMAL NBL: OFF | WLR: OFF NBL: OFF | Abs. Dev. | Rel. Dev. |
|---|---|---|---|---|---|---|---|---|---|---|
| Df1_RO | TF(W1) | sf, -30°C | ~105.469K | 110.840K | | | 66.406K | 80.078K | 60.547K | 49.40% |
| Df2_RO | DRDF(R1) | fs, 125°C | | 1.084M | | | 1.084M | | 529.869K | 49.42% |
| | RDF(R1) | fs, 125°C | | 1.348M | | | 1.348M | | 776.388K | 48.62% |
| | dDRDF(R1) | fs, 125°C | | 1.045M | | | 1.045M | | 520.767K | 49.94% |
| | dRDF(R1) | fs, 125°C | | 1.069M | | | 1.069M | | 524.458K | 49.56% |
| Df3_RO | DRDF(R1) | fs, 125°C | | 498.047K | | | 498.047K | | 236.914K | 56.10% |
| | RDF(R1) | fs, 125°C | | 615.234K | | | 615.234K | | 354.102K | 58.49% |
| | dDRDF(R1) | fs, 125°C | | 468.361K | | | 468.361K | | 212.061K | 57.21% |
| | dRDF(R1) | fs, 125°C | | 488.281K | | | 488.281K | | 244.191K | 57.77% |
| Df4_RO | DRDF(R0) | fast, 125°C | | 3.086G | | | 3.086G | | 263.600M | 8.38% |
| | RDF(R0) | fast, 125°C | | 3.945G | | | 3.945G | | 58.600M | 1.48% |
| | dDRDF(R0) | fast, 125°C | | 1.333G | | | 1.333G | | 316.500M | 22.51% |
| | dRDF(R0) | fast, 125°C | | 1.412G | | | 1.412G | | 319.400M | 21.46% |
| Df5_RO | IRF(R0/R1) | fast, -30°C | | 4.785M | | | 4.785M | | 322.200K | 6.42% |
| | TF(W0/W1) | fast, -30°C | 1.711M | 1.754M | | | 1.145M | ~1.262M | 734.400K | 39.83% |
| Df6_RO | TF(W0) | fast, 125°C | 15.991M | 16.162M | | | 15.430M | 15.869M | 1.270M | 7.69% |
| | TF(W1) | fast, 125°C | 9.058M | 9.180M | | | 7.983M | 8.081M | 1.563M | 16.58% |

Fig. 5a

| Defect | FFM | Corner | WLR: STRONG NBL: ON | WLR: NORMAL NBL: ON | WLR: OFF NBL: ON | WLR: STRONG NBL: OFF | WLR: NORMAL NBL: OFF | WLR: OFF NBL: OFF | Abs. Dev. | Rel. Dev. |
|---|---|---|---|---|---|---|---|---|---|---|
| Df1_RO | TF(W1) | sf, -30°C | ~86.426K | 89.844K | | | 56.152K | ~66.895K | 45.898K | 46.31% |
| Df2_RO | DRDF(R1) | fs, 125°C | | 791.016K | | | 791.016K | | 468.750K | 50.00% |
| | RDF(R1) | fs, 125°C | | 1.538M | | | 1.538M | | 1.025M | 54.26% |
| | dDRDF(R1) | fs, 125°C | | 730.786K | | | 730.786K | | 480.045K | 54.45% |
| | dRDF(R1) | fs, 125°C | | 753.169K | | | 753.169K | | 488.655K | 53.39% |
| Df3_RO | DRDF(R1) | fs, 125°C | | 351.563K | | | 351.563K | | 249.024K | 58.62% |
| | RDF(R1) | fs, 125°C | | 1.493M | | | 1.493M | | 688.500K | 58.75% |
| | dDRDF(R1) | fs, 125°C | | 330.191K | | | 330.191K | | 250.242K | 60.92% |
| | dRDF(R1) | fs, 125°C | | 341.797K | | | 341.797K | | 249.186K | 59.34% |
| Df4_RO | DRDF(R0) | fast, 125°C | | 3.472G | | | 3.472G | | 249.000M | 7.07% |
| | RDF(R0) | fast, 125°C | | 4.135G | | | 4.135G | | 237.400M | 5.63% |
| | dDRDF(R0) | fast, 125°C | | 1.761G | | | 1.761G | | 360.400M | 19.56% |
| | dRDF(R0) | fast, 125°C | | 1.843G | | | 1.843G | | 360.300M | 18.69% |
| Df5_RO | IRF(R0/R1) | fast, -30°C | | 1.611M | | | 1.611M | | 117.200K | 6.90% |
| | TF(W0/W1) | fast, -30°C | 1.469M | 1.500M | | | 1.012M | 1.102M | 585.925K | 37.31% |
| Df6_RO | TF(W0) | fast, 125°C | 13.086M | 13.184M | | | 12.622M | 13.037M | 927.700K | 6.91% |
| | TF(W1) | fast, 125°C | 7.227M | 7.324M | | | 6.421M | 6.690M | 1.196M | 15.91% |

Fig. 5b

| Defect | FFM | Corner | WLR: STRONG NBL: ON | WLR: NORMAL NBL: ON | WLR: OFF NBL: ON | WLR: STRONG NBL: OFF | WLR: NORMAL NBL: OFF | WLR: OFF NBL: OFF | Abs. Dev. | Rel. Dev. |
|---|---|---|---|---|---|---|---|---|---|---|
| Df1_RB | DRDF(R1) | slow, -30°C | | 375.025K | | | 375.025K | | 47.842K | 13.15% |
| | RDF(R1) | slow, -30°C | | 160.712K | | | 160.712K | | 83.865K | 88.82% |
| Df2_RB | DRDF(R0) | slow, -30°C | | 29.879K | | | 29.879K | | 3.693K | 13.84% |
| | RDF(R0) | slow, 125°C | | 26.438K | | | 26.438K | | 3.364K | 13.70% |
| Df3_RB | DRDF(R1) | slow, -30°C | | 400.411K | | | 400.411K | | 57.369K | 17.51% |
| | RDF(R1) | slow, -30°C | | 396.993K | | | 396.993K | | 65.905K | 17.26% |
| Df4_RB | IRF(R0) | slow, 125°C | | 25.926K | | | 25.926K | | 1.953K | 7.68% |
| Df5_RB | IRF(R0) | slow, -30°C | | 2.979K | | | 2.979K | | 1.465K | 58.79% |
| | TF(W0) | slow, -30°C | | 4.883K | 3.715K | 4.395K | 3.906K | | 1.625K | 47.53% |

Fig. 6a

| Defect | FFM | Corner | WLR: STRONG NBL: ON | WLR: NORMAL NBL: ON | WLR: OFF NBL: ON | WLR: STRONG NBL: OFF | WLR: NORMAL NBL: OFF | WLR: OFF NBL: OFF | Abs. Dev. | Rel. Dev. |
|---|---|---|---|---|---|---|---|---|---|---|
| Df1_RB | DRDF(R1) | slow, -30°C | | 231.987K | | | 231.987K | | 24.897K | 10.99% |
| | RDF(R1) | slow, -30°C | | 67.469K | | | 67.469K | | 21.968K | 43.18% |
| Df2_RB | DRDF(R0) | slow, -30°C | | 22.317K | | | 22.317K | | 4.199K | 20.87% |
| | RDF(R0) | slow, 125°C | | 21.580K | | | 21.580K | | 2.488K | 12.71% |
| Df3_RB | DRDF(R1) | slow, -30°C | | 264.696K | | | 264.696K | | 38.078K | 12.93% |
| | RDF(R1) | slow, -30°C | | 225.641K | | | 225.641K | | 26.850K | 12.24% |
| Df4_RB | IRF(R0) | slow, 125°C | | 20.068K | | | 20.068K | | 1.953K | 9.97% |
| Df5_RB | IRF(R0) | slow, -30°C | | 1.515K | | | 1.515K | | 2.441K | 61.71% |
| | TF(W0) | slow, -30°C | | 3.418K | 2.526K | 3.224K | 2.930K | | 1.373K | 56.22% |

Fig. 6b

| | 171 | 172 | 173 |
|---|---|---|---|
| March LZ2 = { | | Ass. Cir. Config. | Sensitized FFMs |
| ME0 | {(w₀); | Don't care | |
| ME1 | {(r₀, w₁); | WLR: OFF<br>NBL: OFF | IRF(RB); DRDF, RDF,<br>dDRDF, dRDF(RO/RB) |
| ME2 | {(r₁, w₀); | WLR: OFF<br>NBL: OFF | IRF(RB); DRDF, RDF,<br>dDRDF, dRDF(RO/RB) |
| ME3 | {(r₀, w₁); | WLR: OFF<br>NBL: OFF | IRF(RB); DRDF, RDF,<br>dDRDF, dRDF(RO/RB) |
| ME4 | {(r₁, w₀); | WLR: OFF<br>NBL: OFF | IRF(RB); DRDF, RDF,<br>dDRDF, dRDF(RO/RB) |
| ME5 | {(r₀, w₁); | WLR: STRONG<br>NBL: OFF | IRF(RO), TF(RO) |
| ME6 | {(r₁, w₀); | WLR: STRONG<br>NBL: OFF | IRF(RO), TF(RO) |
| ME7 | {(r₀, w₁); | WLR: STRONG<br>NBL: ON | TF(RB) |
| ME8 | {(r₁, w₀); | WLR: STRONG<br>NBL: ON | TF(RB) |
| ME9 | {(r₀) } | Don't care | |

ASSIST CIRCUITS FOR SRAM TESTING

BACKGROUND

With the growing demand of high performance, multi-functional and hand-held devices, power consumption has emerged as a major design concern. Simultaneously, technology scaling is shrinking device features as well as lowering transistor threshold voltage, which is associated with an exponential increase in subthreshold leakage current. Therefore, power consumption due to leakage currents (static power) has become a major contributor to the total power consumption in CMOS (Complementary metal-oxide-semiconductor) circuits such as those employed in SRAM (Static Random Access Memory).

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIGS. 5a and 5b show results of assist circuit testing for resistive-open defects in the memory cell of FIG. 1b;

FIGS. 6a and 6b show results of assist circuit testing for resistive-bridging defects in the memory cell of FIG. 1b; and FIG. 7 shows a memory test algorithm for producing the results of FIGS. 5 and 6.

DETAILED DESCRIPTION

Figure 1A:
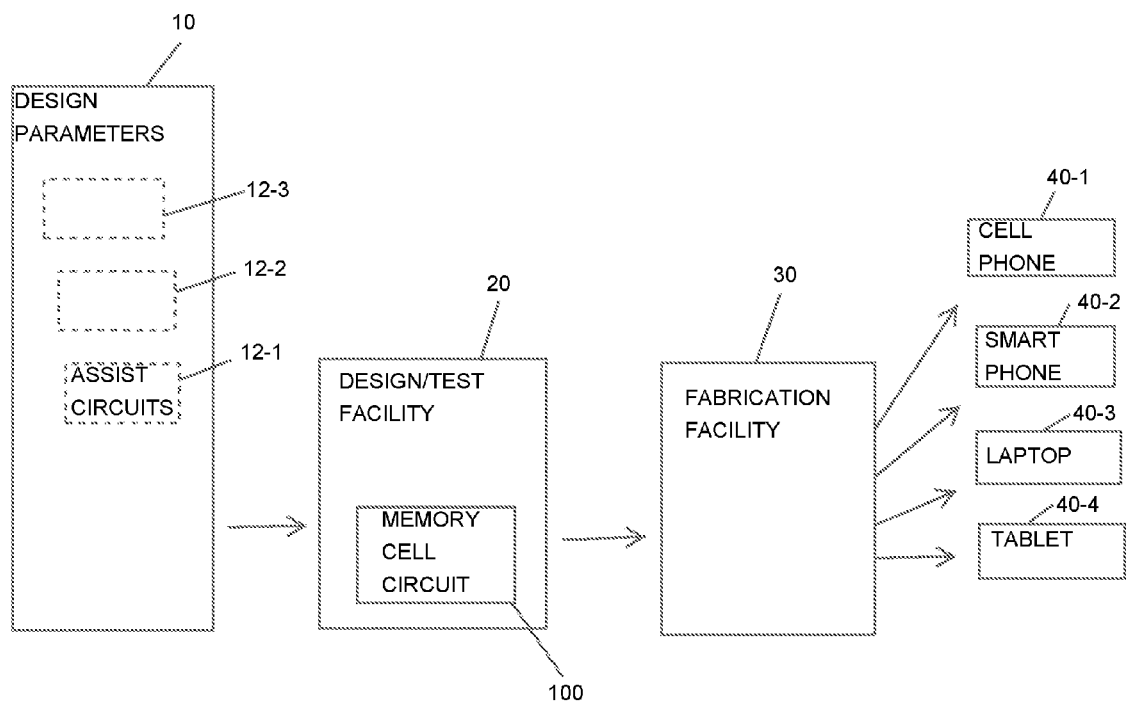
FIG. 1a is a context diagram of a computing environment suitable for use with configurations herein.

Despite increasing static power consumption, aggressive device scaling in each technology generation allows high integration density. Modern system-on-chips (SOCs) are designed using deep-submicrometer technologies that can integrate all components and functions that historically were placed on a printed-circuit board. Within such SOCs, embedded memories are the densest components, accounting for up to 90% of chip area. Hence, embedded memories are arising as the main contributor to the overall SOC static power consumption. Moreover, their dense core-cell array structure prompts them to be vulnerable to physical defects. It is therefore imperative to understand failure mechanisms and to develop effective test solutions for such devices. For example, in configurations herein, a memory circuit corresponds to a single-port word-oriented SRAM designed with a 40 nm low-power process technology.

Modern memory devices implement a dense array of memory cells onto memory chips or modules for inclusion in RAM (random access memory) used in processor based systems. SRAM (static RAM), as opposed to DRAM (dynamic RAM), need not be periodically refreshed thus it is faster, however occupies more space than DRAM. SRAM is therefore typically employed for cache and buffer memories that demand higher speed, while DRAM (Dynamic Random Access Memory) is more suited to general non-volatile storage, for general access, for programs and data due to its small footprint. SRAM designs, due to their dense structure, tend to be more prone to defects that may cause leakage currents but also other unintended behaviors, such as reduction of read and write currents, which may cause incorrect read faults and transition faults. Testing methodologies are employed to identify unintended defects that may affect memory cells and cause, for example, leakage currents or other degradation of read/write currents, characterized by unintended resistive values between circuit elements. Such leakage points are known as potential defects, and are denoted as a resistive value between circuit elements that deviate from an ideal open circuit (infinite resistance), or an ideal closed circuit (0 resistance).

Various design techniques have been investigated for both logic and memory circuits to address the growing issues related to static power consumption. In low-power SRAMs, for example, techniques to reduce supply voltage VDD have drawn attention because they can achieve substantial leakage reduction.

In the field of memory test, test methodologies and simulations are developed to indicate possible faulty behaviors due to SRAM malfunctions. Due to the complex nature of SRAMs, the identification of faulty behaviors and development of efficient test solutions are non-trivial tasks. Configurations herein detect resistive-open and resistive-bridging defects in SRAM core-cells, respectively, based on core-cell layout information. Electrical simulations allow determination of defects that may lead to faulty behaviors, which is significant for minimizing test development effort and producing more efficient and dedicated memory tests.

Configurations herein are based, in part, on the observation that memory cell testing takes the form of a simulation that determines potential defects in the form of resistive values representing unintended current flow through the memory cell. Such "leakage" currents typically result from the small tolerances between the circuit components etched onto the memory chip due to the high density of the components. Unfortunately, conventional approaches to memory cell testing suffer from the shortcoming that certain defects may not appear in testing until the defect is exceedingly large, meaning that unintended current flow deviates substantially from the ideal closed or open value. Accordingly, configurations herein substantially overcome the shortcomings presented by invoking assist circuits connected to particular points in the memory cell circuit. The assist circuits are selectively activated for modifying the voltage along particular circuit elements to identify the potential defects that might be otherwise masked until substantially large.

In configurations disclosed below, read (also called stability) and write assist techniques are employed to allow voltage scaling in low-power SRAMs. In particular, word line level reduction (WLR) and negative bit line (NBL) boost assist techniques improve read stability and write margin of SRAM core-cells, respectively, when the memory operates at a lowered supply voltage. Configurations disclosed below propose a test solution for SRAM devices. Such a test algorithm exploits the configuration of WLR and NBL boost assist techniques as a parameter to maximize the detection of faulty behaviors caused by resistive-open and resistive-bridging defects affecting SRAM core-cells, while minimizing time complexity and area overhead. The disclosed approach demonstrates the most stressful configuration of assist circuits to detect each faulty behavior induced by injected defects. In conventional test approaches, often referred to as March tests, such a configuration of assist circuits is never taken into account. In contrast, the disclosed configurations target the reuse of read and write assist techniques during the test phase of SRAM devices. Such testing is particularly beneficial in the case of system-on-chips (SOCs), and the proposed test strategy is further applicable to all VLSI (Very Large Scale Integration) systems that embed SRAM devices (e.g. SOCs), often designed using deep-submicrometer technologies for SOCs, as discussed above.

Configurations below propose a new memory test (March test), based on the reuse of read and write assist circuits (WLR and NBL boost), during test phase, to maximize coverage of resistive-open and resistive-bridging defects affecting SRAM core-cells (i.e. detect lower resistance values of such defects). In addition to the test simulation disclosed herein, particular configurations may adapt usage for delivered products and embed the proposed approach in a memory BIST (Built-in self test) for product test. Other configurations may be performed without deviating from the configurations and approaches disclosed herein. The disclosed approach exploits the configuration of assist circuits as a parameter to improve coverage of resistive-open and resistive-bridging defects affecting SRAM core-cells up to 89% with respect to memory test approaches that do not take assist circuits into consideration.

FIG. 1a is a context diagram of a computing environment suitable for use with configurations herein. Referring to FIG. 1a, SRAM design employs simulation and test circuits for identifying and correcting defects prior to fabrication. Design of SRAM circuits, such as those using CMOS and other suitable memory circuits, employs design parameters 10. Design parameters include specifications used for the development, test and usage of memory circuits. Individual parameters 12-1 . . . 12-3 (12 generally) include specification of assist circuits for testing a proposed design. A design/test facility employs a memory cell circuit 100, typically in the form of a simulation that can model potential defects. The assist circuits parameters 12-1 are employed in the memory cell circuit 100, discussed in further detail below. Following acceptable performance of a design based on the operation modeled in the memory cell circuit, a fabrication facility 30 produces memory, usually in the form of chips that are incorporated into consumer devices 40, such as cell phones 40-1, smart phones 40-2, laptops 40-3, tablets 40-4, and other suitable personal electronic devices.

Figure 1B:
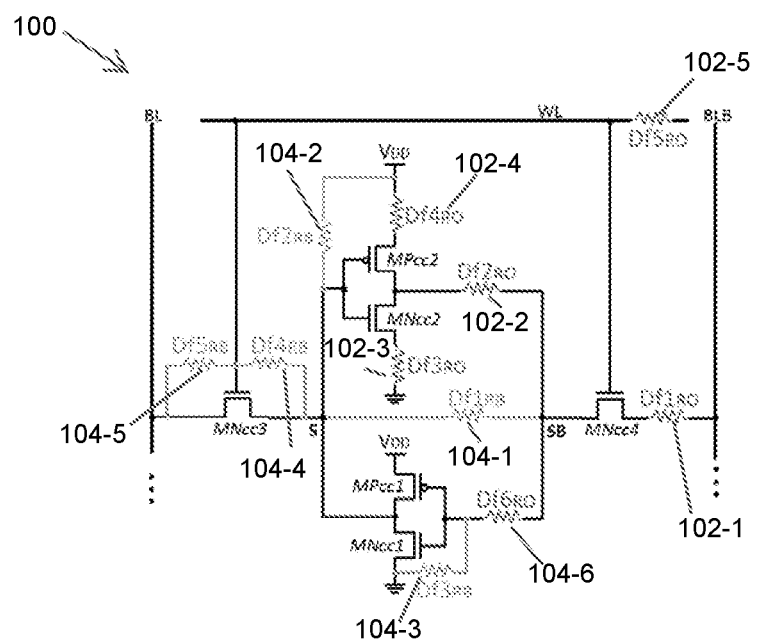
FIG. 1b is a context diagram of a memory cell circuit suitable for use with configurations disclosed herein.

FIG. 1b is a context diagram of a memory cell circuit 100 suitable for use with configurations disclosed herein. The memory cell circuit 100 depicts single SRAM core-cell employed in a simulation for testing and identifying defects in a memory such as an SRAM memory. FIG. 1b shows the location of the injected resistive-open 102-1 . . . 102-6 (102 generally and labeled Df1_RO to Df6_RO) and resistive-bridging 104-1 . . . 104-5 (104 generally and labeled Df1_RB to Df5_RB). The disclosed test employs the assist circuits as parameters for identifying one or more of the defects 102, 104 through functional fault models (FFMs), as enumerated in the results in FIGS. 5a,b and 6a,b below.

Figure 2:
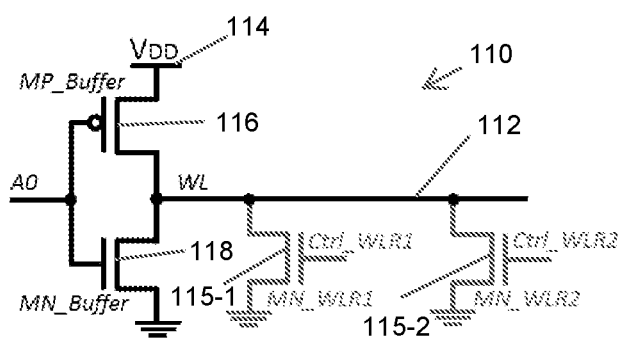
FIG. 2 is a word line level reduction (WLR) assist circuit in the memory cell circuit of FIG. 1b.
Figure 3:
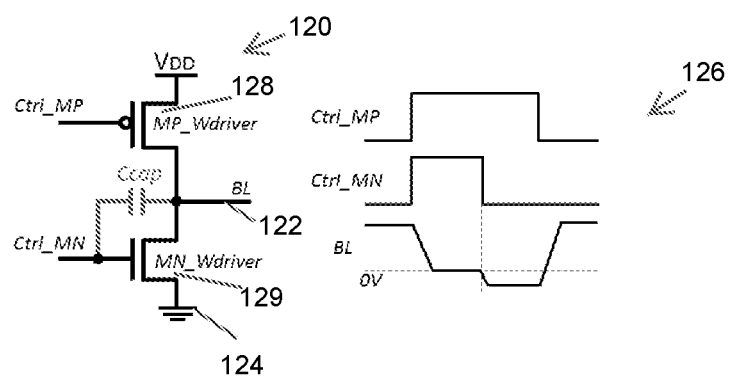
FIG. 3 is a negative bit line (NBL) boost assist circuit in the memory cell circuit of FIG. 1b.

The SRAM circuit 100 employed in configurations herein embeds WLR and NBL) assist circuits, show in FIGS. 2 and 3, respectively. FIG. 2 is a WLR assist circuit for the memory cell circuit of FIG. 1b. Referring to FIGS. 1b and 2, a WLR assist circuit 110 reduces the voltage applied to a word line (WL) 112 to a level lower than SRAM supply voltage VDD 114, when operations are performed. Hence, the WLR assist circuit 110 reduces currents traversing the core-cell 100 when operations are executed. This improves the immunity of core-cells to noise that may disturb storage nodes during read operations and cause data loss.

The WLR assist circuit 110, in the example configuration, is implemented by adding two NMOS transistors 115-1, 115-2 with low drive strength at the WL 112 (transistors MN_WLR1 and MN_WLR2). When the SRAM address decoder selects a given WL 112 to perform an operation, PMOS transistor 116 (MP_Buffer) of the WL buffer is turned on (signal A0, generated by the address decoder, is set to logic '0'). In cases where the WLR assist circuit 110 is disabled, NMOS transistors 115-1 (MN_WLR1) and 115-2 (MN_WLR2) are shut off (signals Ctrl_WLR1 and Ctrl_WLR1 are set to logic '0'). In this case, VDD is driven to the WL 112 through transistor MP_Buffer. Transistors 114 and 116 compose a buffer that drives the WL 112 (each WL of the memory has its own buffer). Such buffers are part of the SRAM address decoder.

WLR assist circuit 110 is therefore defined by a resistive value applied to the word line 112 of the circuit 110 for reducing the voltage level of the word line 112. In the disclosed arrangement of FIG. 2, the WLR assist circuit 110 includes a plurality of NMOS transistors 115 selectively connecting the word line to ground, in which of the NMOS transistors providing a particular resistance value. When the WLR circuit 110 is activated to perform an operation, either transistor MN_WLR1 or MN_WLR2 is turned on, creating a resistive connection between the corresponding WL 112 and ground line. Therefore, when PMOS transistor MP_Buffer of the WL buffer is turned on, a small share of the current driven by such transistor is drained to the ground line, which pulls down the voltage of WL to a level lower than VDD. Transistors MN_WLR1 and MN_WLR2 enable at least two WLR modes in the SRAM as disclosed (1) normal mode and (2) strong mode.

The strong mode providing a lower resistive value and decreases the voltage level of the WL 112 over normal mode. In normal mode, transistor MN_WLR1 is turned on (signal Ctrl_WLR1 is set to logic '1') and transistor MN_WLR2 is turned off (signal Ctrl_WLR2 is set to logic '0'). The connection between WL 112 and ground line only through MN_WLR1 has a high resistance value, thus the voltage level at WL is set to a level that is slightly lower than supply voltage VDD. In the example arrangement, normal mode corresponds to a 40 mV drop in voltage.

In strong mode, both NMOS transistors MN_WLR1 and MN_WLR2 are turned on. Such a configuration creates a connection between WL 112 and a ground line that has lower resistance value compared to normal WLR mode. Therefore, the voltage level applied to the WL 112 in strong mode is lower than the applied voltage level in normal mode. As a consequence, core-cell nodes are less stressed than in normal mode during the read access, which improves the read noise margin (RNM). The strong mode, in the example arrangement, corresponds to a 60 mV voltage drop.

FIG. 3 is a NBL boost assist circuit 120 in the memory cell circuit 100 of FIG. 1b. Referring to FIGS. 1b and 3, the NBL assist circuit 120 reduces the voltage level of the bit line (BL) 122 below 0V during a write operation. Typically, when performing a write operation in a given core-cell 100, the SRAM write driver forces 0V to one BL connected to the core-cell 100. The disclosed NBL assist circuit 120 therefore improves the write margin (WM) of the core-cell 100 by reducing the voltage level of the BL 122 during the write operation. The NBL assist circuit 120 defines a capacitive connection between the BL 122 and the signal applied to the gate of transistor MN_Wdriver. The NBL assist circuit 120 thus, in the example configuration, reduces the voltage level of the BL 122 below 0V, during write operations, referring to voltage level chart 126, due to a capacitive effect. The (NBL) boost assist circuit 120 thus reduces the voltage level of the BL 122 below 0V, during the write operation. Referring to the corresponding voltage level chart 126, the voltage applied to a BL is reduced below 0V when NBL is enabled/activated. This creates a larger VGS (gate voltage) on the pass gate transistors (MNcc3 and MNcc4, in FIG. 1b) of the core-cell 100, which compensate VGS degradation caused by the use of the WLR assist circuit 110. Alternatively, the NBL assist circuit 120 may reduce the voltage to other suitable levels. The activation of the NBL assist circuit 120 therefore improves the write margin (WM) of core-cells, which is defined as the rest of the potential difference between the BL level at which data is flipped and the end-point, or ground line 124, when the NBL 120 is disabled.

Figure 4:
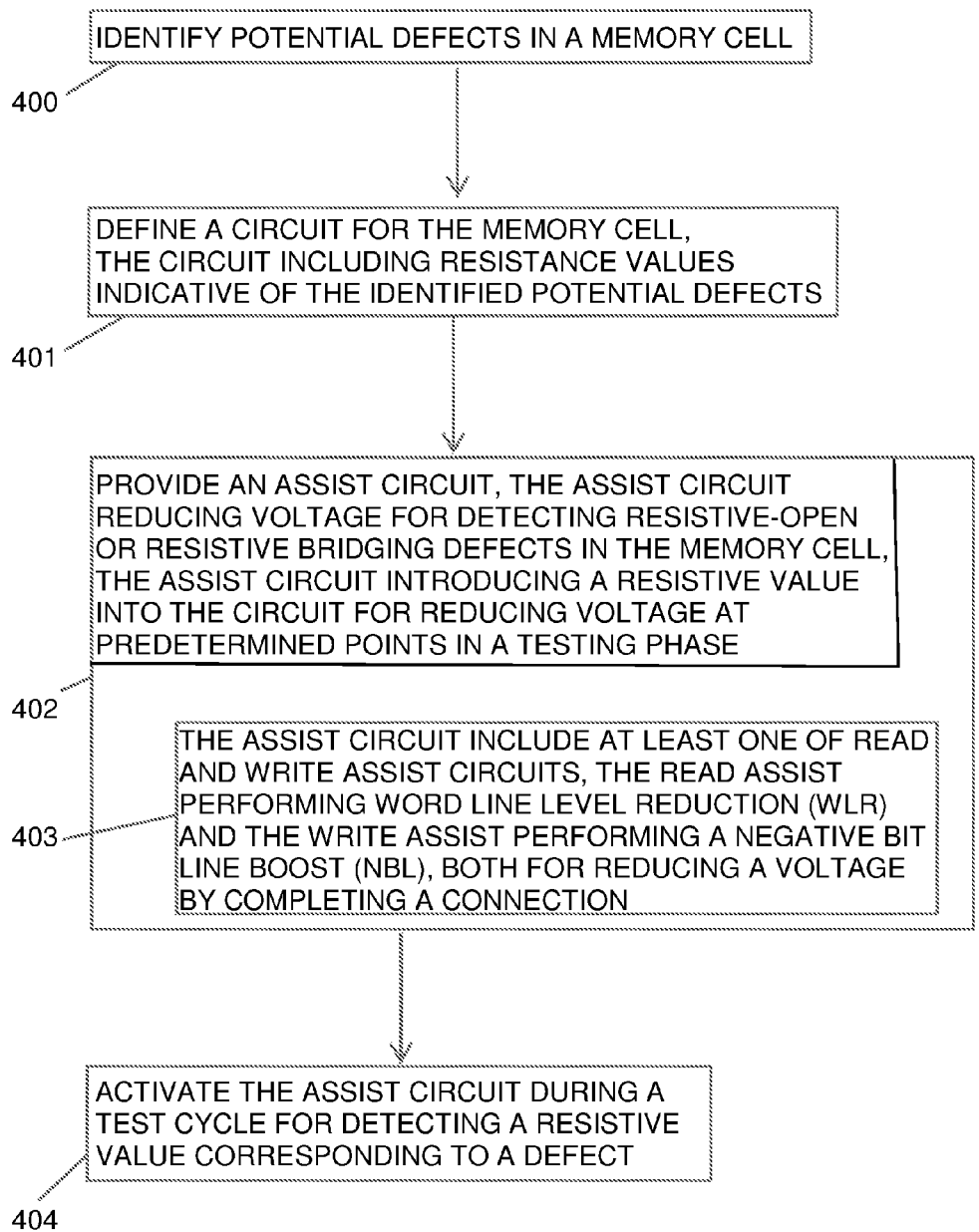
FIG. 4 is a flowchart of memory cell testing using assist circuits as disclosed herein.

FIG. 4 is a flowchart of memory cell testing using assist circuits as disclosed herein. Referring to FIGS. 1b and 4, the method of testing memory designs includes identifying potential defects 102, 104 in a memory cell, as depicted at step 400, and defining a circuit 100 for the memory cell, in which the circuit 100 includes resistance values indicative of the identified potential defects, as depicted at step 401.

A test configuration provides or introduces an assist circuit 110, 120, in which the assist circuit reduces voltage for detecting resistive-open or resistive-bridging defects in the memory cell, by introducing a resistive value into the circuit for reducing voltage at predetermined points in a testing phase, as shown at step 402. The assist circuit includes at least one of read and write assist circuits, the read assist performing WLR and the write assist performing a NBL boost, both for reducing a voltage by completing a connection, as depicted at step 403. The test configuration activates the assist circuit 110, 120 during a test cycle for detecting a resistive value corresponding to a defect 102, 104, as disclosed at step 404.

The previously described assist circuits WLR 110 and NBL 120 allow setting different operating modes on SRAM devices. For the SRAM used as case-study in the disclosed approach, two operating modes can be distinguished: (1) fast mode and (2) slow mode. In fast mode, supply voltage VDD is set to nominal level specified for the technology node (e.g. 1.1V in 40 nm low-power process technology). Such an operating mode ensures high levels of RNM and WM of core-cells, which guarantees correct functioning of read and write operations. Therefore, activation of assist circuits WLR 110 and NBL 120 is optional in fast mode, according to SRAM specifications, which allows the SRAM to operate at high frequency.

In slow mode, also called low-power mode, supply voltage is reduced below nominal operating voltage, such as to 1.0V. Despite achieving static power savings, lowering supply voltage degrades RNM and WM of core-cells. Therefore, particular configurations may turn on assist circuits WLR and NBL in slow mode, which implies performance degradation in contrast to fast mode.

FIGS. 5a and 5b show results of assist circuit testing for resistive-open defects in the memory cell of FIG. 1b. Referring to FIGS. 1b, 5a and 5b, the disclosed tables 130, 140 summarize experimental results for each injected resistive-open defect in slow mode and fast mode, respectively. In both FIGS. 5a and 5b, the first and second columns 131 and 132 list the defect location and functional fault models (FFMs) induced by each defect, respectively. Each defect has a threshold resistance indicative of the value at which a FFM is detectable, as indicated by the values in the tables 130, 140. Defect locations 131 refer to resistive-open 102 and resistive-bridging 104 defects of FIG. 1b. Functional fault models 132 are used to model the faulty behaviors induced by resistive-open and resistive-bridging defects, and are similar to use cases of the tests. Such FFMs include the following:

Transition fault (TF): a core-cell is said to have a TF if it fails to undergo a transition (1→0 or 0→1) when a write operation is performed on it.

Incorrect read fault (IRF): a core-cell is said to have an IRF if a read operation performed on such core-cell returns the incorrect logic value, while keeping the correct data stored previously.

Read destructive fault (RDF): a core-cell is said to have a RDF if a read operation performed on the core-cell changes its contents and returns an incorrect logic value.

Deceptive RDF (DRDF): a core-cell is said to have a DRDF if a read operation performed on it returns the correct logic value, but it changes the contents of the core-cell.

Dynamic RDF (dRDF): a core-cell is said to have a dRDF if a write operation immediately followed by M read operations causes the core-cell to flip its contents, and the incorrect logic value is observed at the SRAM output.

Dynamic deceptive RDF (dDRDF): a core-cell is said to have a dDRDF if a write operation immediately followed by M read operations causes the core-cell to flip its contents, and the correct logic value is observed at the SRAM output.

The third column 133 presents environmental conditions that require the minimal resistance value of defects to cause each faulty behavior, and may vary based on the expected operating environment, such as powered on or powered off. The following six columns 134-139 present the minimal resistance value of defects that cause each faulty behavior. The columns 134-139 present all permutations of the assist circuits 110 and 120 for WLR (110), strong, normal and off, and for NBL (120), on or off. The last columns 141, 142 give the absolute and relative deviation between the highest (dotted outline) and lowest (solid outline) minimal resistance values of defects that cause each faulty behavior, considering all assist circuit configurations. Reference values to calculate relative deviation values is the highest minimal resistance value of defects, which corresponds to least stressful configurations of assist circuits to induce faulty behaviors. In FIGS. 5a and 5b, the configurations of assist circuits corresponding to lowest minimal resistance values of defects that cause each faulty behavior (solid outline) correspond to the so-called worst case configurations of assist circuits (WCAs), and represent a desirable outcome as defects of a smaller nature (lower current loss) are detectable.

WCAs for faulty behaviors caused by resistive-open defects have been determine according to Tables 130 and 140. Such tables show that a setup where WLR 110 is in strong mode and NBL 120 is disabled is the only WCA to detect TFs caused by resistive-open defects (Df5_RO and Df6_RO). Such configuration can also be used to detect IRFs caused by Df5_RO, as it corresponds to one of the two WCAs to maximize detection of such faulty behavior. To detect read destructive faulty behaviors (DRDF, RDF, dDRDF and dRDF) induced by resistive-open defects, two WCAs can be applied: (1) WLR disabled and NBL enabled or (2) WLR disabled and NBL disabled. Configurations herein employ the second option because, besides being a WCA for read destructive faulty behaviors, it also allows detecting lower resistances of Df5_RO and Df6_RO that cause TFs, when compared to the first option.

FIGS. 6a and 6b show results of assist circuit testing for resistive-bridging defects in the memory cell of FIG. 1b. FIGS. 6a and 6b are similar in layout to FIGS. 5a and 5b, however since they refer to resistive-bridging rather than resistive-open, the higher resistance defects that can be detected are sought (solid outline). In FIGS. 6a and 6b, the disclosed tables 150, 160 summarize experimental results for each injected resistive-bridging defect in slow mode and fast mode, respectively. Column labels 131-139 and 141-142 are the same as FIGS. 5a and 5b.

WCAs for faulty behaviors caused by resistive-bridging defects are summarized in tables 150 and 160. These tables show that in a setup where WLR 110 is in strong mode and NBL 120 is enabled is the only WCA to detect TFs caused by Df5_RB. Two WCAs can be applied to detect read destructive faulty behaviors and IRFs, which correspond to the same two settings shown above for detecting read destructive faulty behaviors caused by resistive-open defects. In this case, configurations herein employ the second option in order to use the same WCA as the one used for resistive-open defects. Hence, the same operations used to detect read destructive faults caused by resistive-open defects can also be used to detect such faults and IRFs induced by resistive-bridging defects, which reduces test time.

FIG. 7 shows a memory test for producing the results of FIGS. 5 and 6. As indicated above, a March test is a typical vehicle for memory tests as disclosed herein. A March test consists of a sequence of March elements. A March element consists of a sequence of operations applied to each cell in the memory, before proceeding to the next cell. An operation can consist of writing a 0 into a cell (w0), writing a 1 into a cell (w1), reading a cell with expected value 0 (r0), and reading a cell with expected value 1 (r1). After all operations of a March element have been applied to a given cell, they will be applied to the next cell. The address of the next cell is determined by the address order. An increasing address order, from address 0 to n−1 is denoted by the ↑ symbol; and a decreasing address order, from address n−1 down to 0, is denoted by the ↓ symbol. When the address order is irrelevant, the ↕ is used.

In execution of a March test according to FIG. 7, each element defines a test cycle on the defined core-cell circuit 100, such that the test includes a sequence of elements ME0 . . . ME9, each element inducing at least one functional fault model (FFM) indicative of a failing resistance level in a particular potential defect 102, 104. The potential defect is either a resistive-bridging 104 or resistive-open 102 defect defined by a resistive value in the circuit, such that the resistive value simulates an unintended conductive coupling in the circuit. The test results as exemplified in tables 130, 140, 150 and 160 compute a resistance value corresponding to an identified potential defects. Each element selectively enabling or disables the assist circuit for identifying a resistive value at which a potential defect is detectable and identifies a FFM associated with the potential defect. In FIG. 7, the disclosed March test is depicted in a table 170. Referring to FIGS. 2, 3, and 5-7, March elements ME0 through ME9 depict the conditions for each element. For each element, columns define parameters for the test. Column 171 depicts the operations of the element, as disclosed above. Column 172 shows the settings of the WLR 110 and NBL 120 assist circuits, as denoted in the available settings above for columns 134-139, and column 173 shows the FFMs implicated in the test.

In operation, ME0 initializes the core-cell array with logic '0'. The configuration of assist circuits is not relevant in ME0. Next, ME1 to ME4 can sensitize static and dynamic read destructive faulty behaviors, which must be done with WLR and NBL disabled. In such MEs, sensitization of dDRDFs and dRDFs is ensured by read equivalent stress (RES). Therefore, ME1 to ME4 must be executed using word line after word line (fast x) addressing order. Note that ME1 and ME3 have the same operations but with opposite addressing order to maximize RES in all core-cells of the row. The same observation is valid for ME2 and ME4. ME1 to ME4 also use RES to sensitize DRDFs. In ME1, for example, the last operation is a w1. To complete the sensitization of a DRDF, a r1 operation must be executed. Instead, such r1 operation can be replaced by the first RES produced when ME1 is executed in other core-cells of the same row. This allow eliminating four read operations (one read in each ME from ME1 to ME4), reducing test time.

ME5 and ME6 sensitize TFs and IRFs caused by resistive-open defects. Sensitization of such FFMs must be done with WLR in strong mode and with NBL disabled. ME7 and ME8 sensitize TFs caused by resistive-bridging defects, with WLR in strong mode and NBL enabled. Finally, ME9 detects TFs sensitized during execution of ME8. Hence, configuration of assist circuits is not relevant in ME9. As a final observation about March LZ2, note that faulty behaviors related to read operations are tested for both cases, when reading logic '1' and logic '0' from core-cells. Similarly, faulty behaviors related to write operations are tested for both cases, when writing logic '1' and logic '0' in core-cells. This allows detecting similar faults due to defects symmetrically placed with respect to those of FIG. 1b.

In a particular arrangement, such as that shown in FIG. 1a, a system for testing memory includes a circuit model for identifying potential defects in a memory cell, such as assist circuits 12-1 and other parameters such as resistive values 12. An SRAM design test facility 20 includes test simulator defining a circuit 100 for the memory cell, such that the circuit includes resistance values indicative of the identified potential defects. An interface allows incorporation of an assist circuit, such that the assist circuit is for reducing voltage for detecting resistive-open or resistive-bridging defects in the memory cell. The assist circuit introduces a resistive value into the circuit 100 for reducing voltage at predetermined points in a testing phase. In the case of WLR, the implementation is done by inserting low drive strength transistors (i.e. resistances) between the WL and GND. However, NBL boost is achieved through capacitive effects. A test script 170 (FIG. 7) provides for activating the assist circuit during a test cycle for detecting a resistive value corresponding to a defect, the test simulator responsive to the script, and an output device is operable for receiving results of execution of the test script 170 and rendering corresponding results.

Those skilled in the art should readily appreciate that the programs and methods defined herein are deliverable to a user processing and rendering device in many forms, including but not limited to a) information permanently stored on non-writeable storage media such as ROM devices, b) information alterably stored on writeable non-transitory storage media such as floppy disks, magnetic tapes, RAM devices, and other magnetic and optical media, or c) information conveyed to a computer through communication media, as in an electronic network such as the Internet or telephone modem lines. The operations and methods may be implemented in a software executable object or as a set of encoded instructions for execution by a processor responsive to the instructions. Alternatively, the operations and methods disclosed herein may be embodied in whole or in part using hardware components, such as Application Specific Integrated Circuits (ASICs), Field Programmable Gate Arrays (FPGAs), state machines, controllers or other hardware components or devices, or a combination of hardware, software, and firmware components.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A method of testing memory designs comprising:
identifying potential defects in a memory cell;
defining a circuit for the memory cell, the circuit including resistance values indicative of the identified potential defects;
providing an assist circuit, the assist circuit reducing voltage for detecting resistive-open or resistive-bridging defects in the memory cell, the assist circuit introducing a resistive value into the circuit for reducing voltage at predetermined points in a testing phase; and
activating the assist circuit during a test cycle for detecting a resistive value corresponding to a defect.

2. The method of claim 1 further comprising executing the test cycle on the defined circuit, the test including a sequence of elements, each element inducing at least one functional fault model (FFM) indicative of a failing resistance level in a particular potential defect.

3. The method of claim 1 wherein the potential defect is a resistive-bridging or resistive-open defect defined by a resistive value in the circuit, the resistive value simulating unintended conductive coupling in the circuit.

4. The method of claim 3 further comprising computing a resistance value corresponding to identified potential defects.

5. The method of claim 2 wherein the assist circuit includes at least one of
read and write assist circuits, the read assist performing word line level reduction (WLR) and the write assist performing a negative bit line (NBL) boost, both for reducing a voltage by completing a connection.

6. The method of claim 5 wherein the WLR assist circuit is defined by a resistive value applied to a word line of the circuit for reducing the voltage level of the word line.

7. The method of claim 6 wherein the WLR assist circuit includes a plurality of NMOS transistors selectively connecting the word line to ground, each of the NMOS transistors providing a particular resistance value.

8. The method of claim 7 wherein the WLR includes normal and strong mode, the strong mode providing a lower resistive value and decreasing the voltage level of the write line over normal mode.

9. The method of claim 5 wherein the NBL assist circuit reduces the voltage level of the bit line during a write operation.

10. The method of claim 9 wherein the NBL assist circuit defines a connection from the bit line for reducing the voltage of the bit line below 0 volts.

11. The method of claim 2 wherein each defect has a threshold resistance indicative of the value at which a defect is detectable.

12. The method of claim 11 wherein the test cycle includes a plurality of elements, each element determining enablement of the assist circuit for identifying a resistive value at which a potential defect is detectable and identifying a FFM associated with the potential defect.

13. The method of claim 1 wherein the circuit corresponds to a single-port word-oriented SRAM with a 40 nm low-power process technology.

14. The method of claim 1 wherein the introduced resistance values define the location of the detected defect.

15. The method of claim 14 wherein the resistance value defines a threshold resistance corresponding to a current flow at which the defect occurs.

\* \* \* \* \*